United States Patent [19]

Juuti

[11] 3,993,162

[45] Nov. 23, 1976

[54] ACOUSTIC SPEAKER SYSTEM

[76] Inventor: Kenneth Juuti, R.R. No. 1, Port Washington, British Columbia, Canada, V0N-2T0

[22] Filed: June 20, 1975

[21] Appl. No.: 588,724

[52] U.S. Cl. .................................. 181/156; 181/153; 181/194; 181/160

[51] Int. Cl.[2] ..................... H05K 5/00; G10K 13/00

[58] Field of Search ............................ 181/148–160, 181/193, 194, 144–147; 179/1 E

[56] References Cited

UNITED STATES PATENTS

| | | | |
|---|---|---|---|
| 1,741,274 | 12/1929 | Baumann | 181/156 |
| 2,822,884 | 2/1958 | Simpson | 181/156 |
| 2,866,513 | 12/1958 | White | 181/156 |
| 2,871,971 | 2/1959 | Beecroft et al. | 181/155 |
| 3,122,215 | 2/1964 | Sutton | 181/160 |
| 3,393,766 | 7/1968 | Mitchell | 181/153 |
| 3,523,589 | 8/1970 | Virva | 181/151 |

*Primary Examiner*—Stephen J. Tomsky
*Attorney, Agent, or Firm*—Francis Swanson

[57] ABSTRACT

A speaker enclosure for a stereophonic sound system is disclosed. The speaker is mounted in a chamber, the enclosure of which is connected to a tube of relatively long length and of circular cross-section. The construction is such that phase-inversion occurs so that the sound emanating from the rear of the speaker reinforces sound from the front of the speaker. The construction also substantially suppresses standing waves.

7 Claims, 3 Drawing Figures

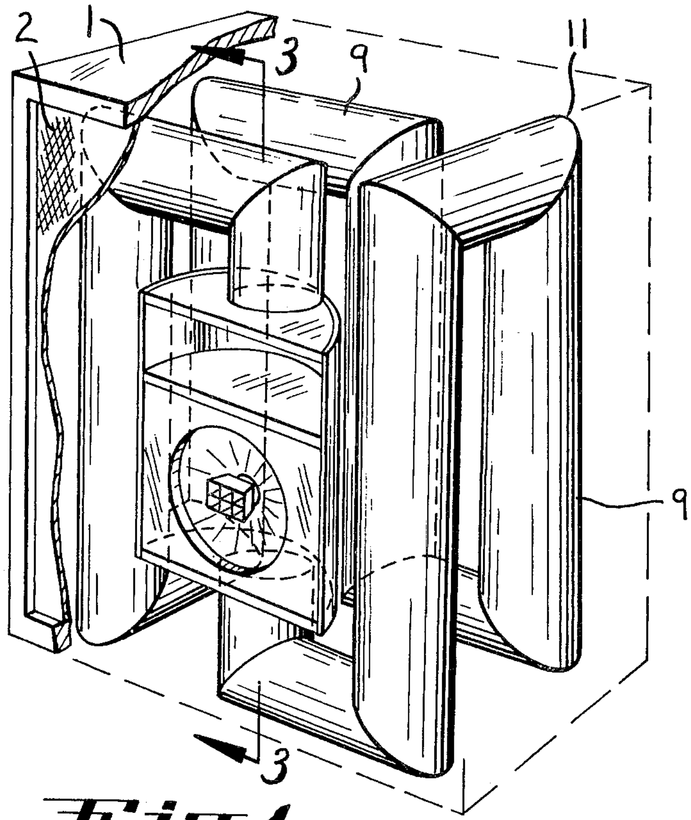
Fig 1
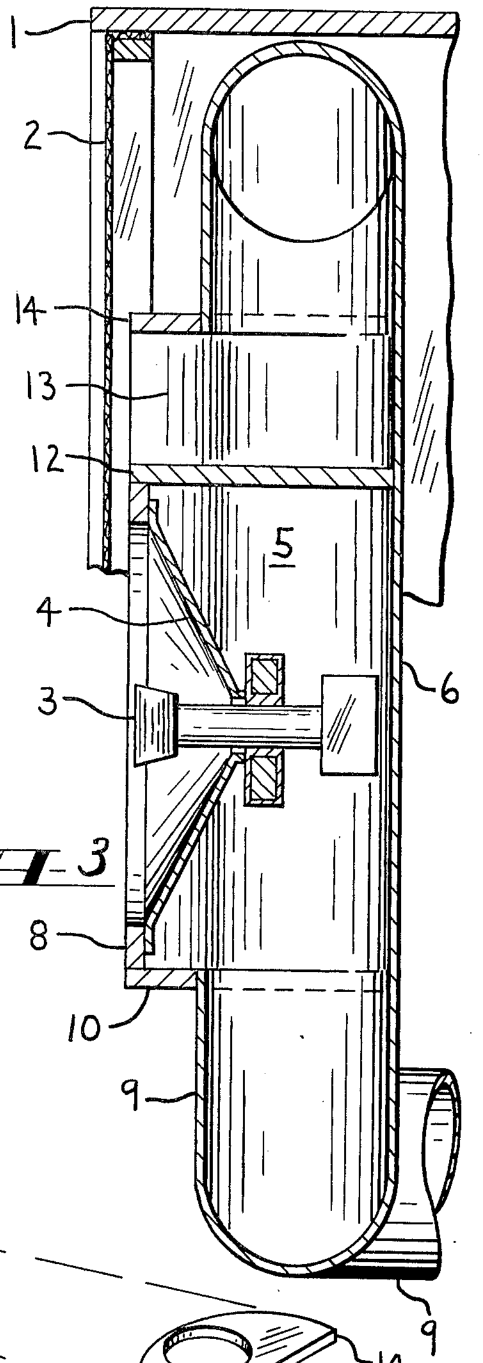
Fig 3
Fig 2
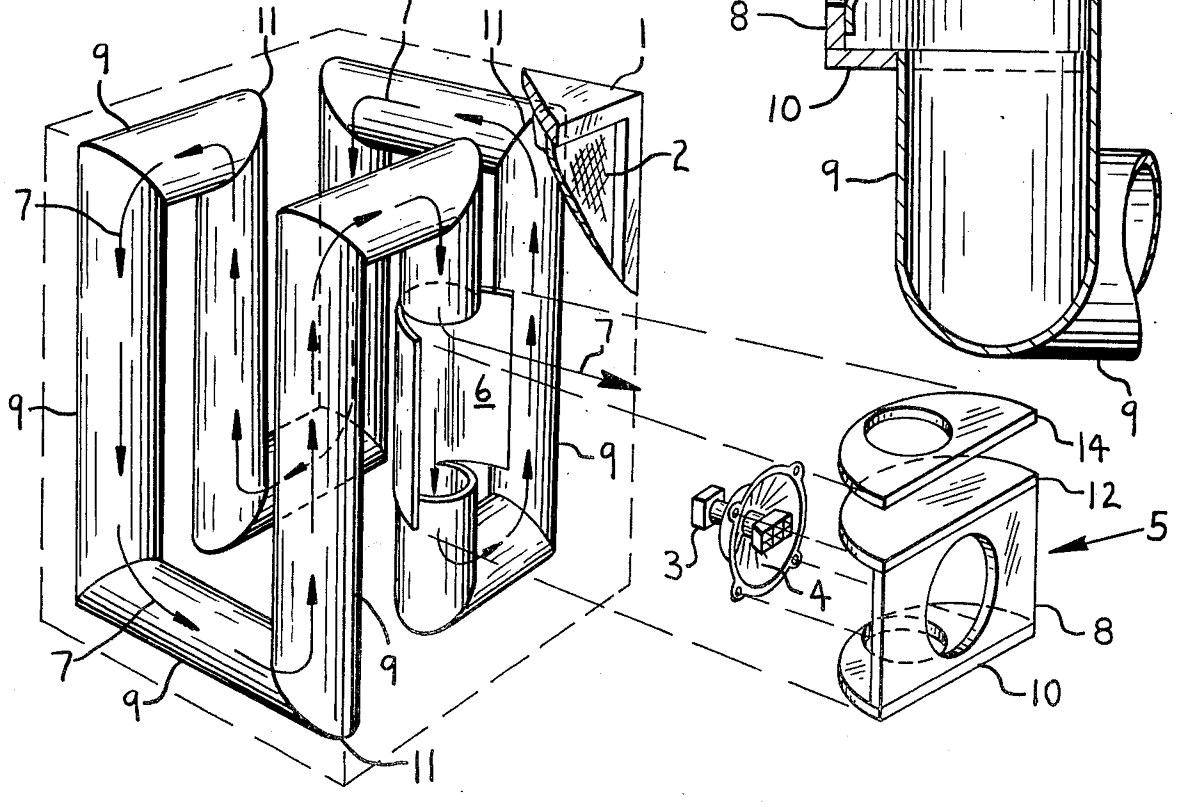

ACOUSTIC SPEAKER SYSTEM

BACKGROUND OF THE INVENTION

1. Field of the Invention

The invention relates to stereophonic sound systems in general and more particularly to speaker enclosures for use therewith.

2. Description of the Prior Art

Several different approaches to the problem of enclosing a sound speaker presently exists in the prior art. Among these are the flat baffle, the open back enclosure, the infinite baffle, slotted enclosures which are designed to let out sound emanating from the back of the speaker, acoustic labrynths and enclosures built around the principles of horn design. An example of the latter is the Klipsch folded horn enclosure described in U.S. Pat. No. 2,310,243, the construction of which is familiar to all those skilled in the art of enclosure design. Various combinations of these devices will be found in the prior art as well.

An essential function of the speaker enclosure is to deal with the sound radiating from the rear of the speaker cone. A cone in motion alternately compresses and rarefies the air in front and in back of it. Since these two wave trains generated by the speaker are out of phase, care must be taken in the design of the enclosure to ensure against cancellation of one set of waves by the other. This design consideration is particularly important for middle and low frequency range sound reproduction.

Many speaker enclosures simply attempt to eliminate the effect of the sound radiation from the back of the speaker. This is illustrated by the construction known as the infinite baffle wherein a speaker is mounted in a wall between two rooms. The wall is of such large size and volume that it shields the speaker's front radiation from its rear radiation and the latter is completely lost. Other designs attempt to recover and make use of the radiation from the back of the speaker. One such approach is shown in U.S. Pat. No. 3,523,589.

SUMMARY OF THE INVENTION

A principal object of the present invention is to provide a means of using the sound radiation from the rear of the speaker to reinforce the sound radiation from the front of the speaker. A further object is to provide a construction that substantially suppresses standing waves within the system. Other objects and advantages of the present invention will be apparent to those skilled in the art.

BRIEF DESCRIPTION OF THE DRAWINGS

FIG. 1 is a perspective view of the interior construction of the invention and the cabinet partly in phantom.

FIG. 2 is a perspective view of the invention partially exploded to show the sound path and the relation of certain significant parts of the construction.

FIG. 3 is a sectional view taken along line 3—3 of FIG. 1.

DETAILED DESCRIPTION

Referring now to the drawings, FIG. 2 shows an outer housing 1 partially in phantom with a cloth front 2. Within the housing 1 is a speaker 3 having a cone 4 mounted in a chamber 5. The chamber 5 has a curved back 6, a front panel 8, to which speaker 3 is mounted, a bottom panel 10, and a middle panel 12. Mounted in housing 1 adjacent speaker 3 is a sound exit chamber 13. Chamber 13 is formed by an extension of back 6, middle panel 12 and top panel 14. As shown in FIG. 1, chamber 5 is connected to chamber 13 by an air path 7 comprised of a series of tubular sections 9 and elbows 11. The tubular sections 9 are uniform in cross-section and vary only in length. The cross-section is preferably circular, although it may be elliptic. The elbows 11 are formed by cutting the tubular sections 9 at a 45° angle before joining them. It is of course obvious that a conventional 90° elbow of larger or smaller radius could be used in the construction. The illustrated construction is preferred because of its simplicity of manufacture. Although the housing 1 is shown largely in phantom, it is preferably made of heavy wood with a suitable exterior finish to provide an attractive enclosure. The front 2 of the housing is made of a suitable cloth material chosen for its attractive appearance.

OPERATION OF THE INVENTION

Background Theory

The velocity of sound in air at 20° centigrade is approximately 1,129 feet per second. The wave length of sound radiating from a speaker may be determined from the well-known relation that the product of the frequency times the wave length is equal to the velocity of the sound. Thus, with an ambient air temperature of 20° centigrade, a speaker resonating at 50 Hertz will produce sound having a wave length of 22.6 feet.

It is well-known that a pipe or tube having an open end and a closed end will resonate with a natural frequency equal to the velocity of sound in air at the ambient temperature divided by four times the length of the tube. It is further known that in a closed end tube, only the fundamental frequency and the odd harmonics are present. Further analysis shows that a closed end resonating tube can be used to produce phase inversion because the closed end will be a node while the open end will be an anti-node. That is, the displacement of air particles at the closed end is always zero while at the open end the air particles are in motion. A clear explanation of the physics of resonating pipes with a closed end is given in Chapter 22 of the book titled *College Physics*, 2nd Ed., 1955, by Francis Sears and Mark Zemansky, Addison Wesley Publishing Company, Inc., Cambridge, Mass. With these physical principles in mind, the operation of the invention can be understood.

Phase Inversion

An electrical signal is impressed upon the speaker 3 causing it to vibrate. Sound energy will be radiated out into the room from the front of the speaker 3. At the same time, sound energy from the rear of the speaker will be radiated into chamber 5. However, the sound energy from the front and the rear of the speaker 3 will be out of phase. That is, for a single vibration of the speaker cone 4, the air in front of the speaker cone 4 will be compressed while the air directly behind the speaker cone 4 will be rarefied. Now, chamber 5 is completely enclosed except for the exit to sound path defined by tube sections 9 and elbows 11. This series of tubes and elbows actually comprises a folded pipe. Chamber 5 being completely enclosed, the air within the chamber has a certain "stiffness" or impedance so that it loads the pipe composed of tubes 9 and elbows 11 in such a manner as to make it resonate and behave like a closed end pipe. As previously noted, in a closed end resonating pipe, one end will always vibrate in a mode opposite the other end. Thus, if one end of the tube is a node, the opposite end will be an anti-node. That is, a phase inversion will occur. This phase inversion is exactly the result desired to produce reinforcement of the sound radiating from the front of the speaker with the sound from the rear of the speaker. The length of the tube sections and elbows is chosen so that its fundamental resonant frequency or one of its odd harmonic frequencies matches or nearly matches that of the speaker 3. Sound radiating from the front of the speaker will be reinforced by the sound radiating from the rear of the speaker 3 because of the phase inversion produced by the combination of chamber 5 and tubes 9 and elbows 11 which comprise air path 7.

Standing Wave Suppression

Longitudinal sound waves traveling along the air path of a tube are reflected at the ends of the tube giving rise to a train of waves of the same form but traveling in opposite directions. The interaction of these two wave trains traveling in opposite directions can produce a system of standing waves wherein the reflected train fits in with the progressing train to produce a non-progressive wave system characterized by increased amplitude and the presence of nodes. As will be explained below, the design of the invention is such that in operation it acts to strongly suppress such standing waves.

Consider the action of wave trains traveling down air path 7 consisting of tubes 9 and elbows 11. These are longitudinal plane waves consisting of alternate series of compressions and rarefractions of the particles of air within the air path. As the plane wave front reaches the end of a tube section 9, reflection must take place from the cylindrical concave surface presented by the interior of an elbow 11. Since the reflecting surface is concave, reflection of the longitudinal wave begins at the edge of the wave front where, because of the curvature, the angle of incidence constantly changes. The continuity of the wave front is disturbed and its form distorted. The reflectd wave front no longer resembles the advancing wave train front and the conditions for superposition and reinforcement which produce standing waves are substantially avoided. This distortion and change in character of the longitudinal wave front greatly reduces the amplitude of the relected wave. Further, because the cross-section of the tube is circular, there are no parallel planar surfaces along the length of the tube for waves to reflect from. All of the reflecting surfaces are concave.

Damping of reflected sound waves may be further enhanced by constructing the tubes of a suitable sound absorbing material.

Reflection of waves from curved surfaces is explained in Chapter 6 of the book titled *Acoustics and Vibrational Physics*, 2nd Edition, 1966, by R. W. B. Stevens and A. E. Bate, Edward Arnold Publishers Ltd., London. Numerous well-known works on physical optics also treat the general subject thoroughly.

SUMMARY

In operation, the speaker radiates energy into the room from the front and radiates a like amount of energy into chamber 5 which is closed except for the opening to the air column represented by tubes 9 and elbows 11. The impedance of this chamber 5 is such as to make the air columns composed of tubes 9 and elbows 11 resonate in accordance with the principles of a closed end tube and cause phase inversion. The length of the tube sections 9 and elbows 11 will be such that the fundamental frequency or one of the odd numbered harmonics present will closely match the resonating frequency of the speaker and the sound radiated from the front of the speaker will be reinforced by the sound radiating from the rear of the speaker into chamber 5 and through the resonating air column represented by tubes 9 and elbows 11.

The combination of tubes 9 connected in series to form elbows 11 which present concave reflecting surfaces to the advancing wave train in the sound path 7 acts to severely damp and distort reflected waves and substantially destroy the conditions under which standing waves arise.

Having described the preferred embodiment of my invention, it will become apparent to those skilled in the art that other modifications and arrangements may be made without departing from the true spirit and scope of the invention. For example, it would be readily apparent to place within the series of the tubes 9 and elbows 11 a tube section whose length could be varied manually after the manner of a slide trombone. It will be further apparent to those skilled in the art that a plurality of speakers of differing frequencies could be operatively connected to the tubular sound path 7 at appropriate points along its length. These speakers could be operated simultaneously or sequentially or appropriately mixed to produce the desired low frequency response curve from the system. I claim as my invention all those modifications as come within the true spirit and scope of the appended claims.

I claim:

1. A sound speaker enclosure comprising:
an outer housing;
(means defining) a single chamber within and separate from the housing having a first and second cavity the cavities separated by a solid baffle;
a sound speaker mounted within the first cavity;
a plurality of alternately vertical and horizontal tube sections connected in series within the housing and interposed between the first cavity of the chamber and the second cavity;
the tube sections defining a single continuous alternately vertical and horizontal closed sound path between the cavities;
the path including at least three successive tube sections joined so that the longitudinal axis of each section is perpendicular to the longitudinal axis of the other two.

2. A sound speaker enclosure comprising:
an outer housing;
means within and separate from the housing defining a unitary chamber having a first upper cavity and a second lower cavity the chamber divided by a solid baffle;
a sound speaker mounted within the lower cavity separate from and below the baffle;
a plurality of tubular sections connected in alternately vertical and horizontal series, the series including a first tube section connected vertically from the lower cavity;
a second tube section joined normal to the first tube section and lying in a horizontal plane;
a third tube section joined normal to the second section parallel to the first tube section so that the first second and third sections lie in a common plane;

a fourth tube section joined to the third tube section at an angle to the plane common to the first three sections;

the tube sections interposed between the first cavity and the second cavity and defining a continuous closed non-linear sound path between the first and second cavities, the last tube section terminating in the upper cavity.

3. Apparatus according to claim 2 wherein each tubular section is formed from tubing with a cross-section having a circumference which defines a continuous elliptical closed curve.

4. Apparatus according to claim 2 wherein each successive tubular section in the sound path is joined to the preceding section to form a square cornered elbow.

5. A sound speaker enclosure comprising:

an outer housing;

an elongate vertical chamber having a semi-cylindrical shaped back, the chamber divided into two compartments and having an upper, a middle and a lower baffle;

a plurality of tubular members connected on an alternately vertical and horizontal series to form a continuous closed sound path from one compartment of the chamber to the other compartment of the chamber, the path including at least five tube members;

the first, second and third tube members joined in a common plane to form a U-shaped section having two parallel legs;

the third, fourth and fifth members joined in a common plane to form a U-shaped section having two parallel legs;

the common plane of the first, second and third members intersecting the common plane of the third, fourth and fifth members at the longitudinal axis of the third member;

the third tube member common to both planes;

each tubular member angularly connected to its predecessor to form a square cornered elbow, the inner surface of the elbow forming a concave reflective surface defined by the intersect of two cylinders within the sound path.

6. Apparatus according to claim 5 wherein the concave reflecting surface is semi-cylindrical and is substantially normal to the direction of sound wave travel within the sound path so that the semi-cylindrical surface damps impinging sound waves and any standing waves present are substantially suppressed.

7. Apparatus according to claim 5 wherein the fundamental resonant frequency of the closed sound path defined by the tubular members is substantially the same as the resonant frequency of the speaker.

* * * * *